(12) United States Patent
Werner

(10) Patent No.: US 9,064,887 B2
(45) Date of Patent: Jun. 23, 2015

(54) FIELD-EFFECT SEMICONDUCTOR DEVICE AND MANUFACTURING METHOD THEREFOR

(75) Inventor: Wolfgang Werner, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/602,614

(22) Filed: Sep. 4, 2012

(65) Prior Publication Data

US 2014/0061647 A1 Mar. 6, 2014

(51) Int. Cl.
  *H01L 29/66* (2006.01)
  *H01L 29/872* (2006.01)
  *H01L 29/78* (2006.01)

(52) U.S. Cl.
  CPC .... *H01L 29/66431* (2013.01); *H01L 29/66893* (2013.01); *H01L 29/872* (2013.01); *H01L 29/78* (2013.01); *H01L 2924/0002* (2013.01)

(58) Field of Classification Search
  CPC .............................. H01L 29/78; H01L 29/872
  USPC ................................................... 257/E29.049
  See application file for complete search history.

(56) References Cited

U.S. PATENT DOCUMENTS

| 6,351,018 | B1 | 2/2002 | Sapp |
| 7,138,668 | B2 * | 11/2006 | Hayashi et al. ............... 257/183 |
| 7,781,786 | B2 | 8/2010 | Hayashi et al. |
| 2003/0201482 | A1 * | 10/2003 | Shimoida et al. ............. 257/302 |
| 2004/0212011 | A1 | 10/2004 | Ryu |
| 2005/0224838 | A1 * | 10/2005 | Tanaka et al. ................. 257/187 |
| 2007/0012946 | A1 * | 1/2007 | Sankin et al. ................. 257/134 |
| 2007/0200115 | A1 * | 8/2007 | Das et al. ........................ 257/77 |

FOREIGN PATENT DOCUMENTS

DE 10005774 B4 9/2005

OTHER PUBLICATIONS

Tetsuya Hayashi, et al. "New High-Voltage Unipolar Mode p+ Si/n-4H-SiC Heterjunction Diode." Materials Science Forum, 2005. vols. 483-485. Trans Tech Publications, Switzerland. pp. 953-956.
H. Tanaka, et al."Ultra-low Von and High Voltage 4H-SiC Heterojunction Diode." Proceedings of the 17th International Symposium on Power Semiconductor Devices and IC's. May 23-26, 2005. Santa Barbara, CA. IEEE. pp. 1-3, 162.

* cited by examiner

*Primary Examiner* — Marc Armand
*Assistant Examiner* — Quinton Brasfield
(74) *Attorney, Agent, or Firm* — Murphy, Bilak & Homiller, PLLC

(57) ABSTRACT

According to an embodiment of a field-effect semiconductor device, the field-effect semiconductor device includes a semiconductor body and a source electrode. The semiconductor body includes a drift region, a gate region and a source region of a first semiconductor material having a first band-gap and an anode region of a second semiconductor material having a second band-gap lower than the first band-gap. The drift region is of a first conductivity type. The gate region forms a pn-junction with the drift region. The source region is of the first conductivity type and in resistive electric connection with the drift region and has a higher maximum doping concentration than the drift region. The anode region is of the second conductivity type, forms a heterojunction with the drift region and is spaced apart from the source region. The source metallization is in resistive electric connection with the source region and the anode region.

16 Claims, 4 Drawing Sheets

FIELD-EFFECT SEMICONDUCTOR DEVICE AND MANUFACTURING METHOD THEREFOR

TECHNICAL FIELD

Embodiments of the present invention relate to field-effect semiconductor devices, in particular to power field-effect transistors having an integrated diode, and to related methods for producing field-effect semiconductor devices.

BACKGROUND

Semiconductor transistors, in particular field-effect controlled switching devices such as a Junction Field Effect Transistor (JFET), a Metal Oxide Semiconductor Field Effect Transistor (MOSFET) and an Insulated Gate Bipolar Transistor (IGBT) have been used for various applications including but not limited to use as switches in power supplies and power converters, electric cars, air-conditioners, and even stereo systems. Particularly with regard to switch-mode power supplies, power transistors capable of switching large currents and/or operating at higher voltages and having a particularly low power loss are often desired. During operation of a switch-mode power supply, a body diode formed between a body region and a drift region of the Field-Effect Transistor (FET) may be switched in forward direction. In this operational status a loss occurs which depends on the forward voltage drop of the body diode. Furthermore, depleting the drift region during switching the FET results in switching losses. The switching losses increase with increasing operating frequency which is often desired to reduce weight and size of the switch-mode power supply.

An external or integrated Schottky diode may be used as a so-called free-wheeling diode to reduce switching losses. However, external Schottky diodes require external wirings resulting in additional inductivities. Integrated Schottky diodes typically require additional wafer space and/or a more complex processing. This may result in higher costs.

Accordingly, there is a need to improve field-effect semiconductor transistors.

SUMMARY

According to an embodiment of a field-effect semiconductor device, the field-effect semiconductor device includes a semiconductor body of a first band-gap material and having a main surface. The semiconductor body includes in a cross-section which is substantially vertical to the main surface: a drift region of a first conductivity type; a first channel region of the first conductivity type which adjoins the drift region; a first gate region which forms a first pn-junction with the first channel region; a first body region which is arranged below the first gate region and forms a second pn-junction with the first channel region such that the first channel region is arranged between the first pn-junction and the second pn-junction; and a first source region of the first conductivity type which has a higher maximum doping concentration than the first channel region and adjoins the first channel region. An anode region of a second band-gap material having a second band-gap which is lower than a band-gap of the first band-gap material forms a heterojunction with the drift region. The anode region is of a second conductivity type. The heterojunction and the first source region do not overlap when seen from above.

According to an embodiment of a field-effect semiconductor device, the field-effect semiconductor device includes a semiconductor body of a first band-gap material and having a main surface. The semiconductor body includes in a cross-section which is substantially vertical to the main surface: a drift region of a first conductivity type which extends to the main surface; two channel regions of the first conductivity type which are spaced apart by the drift region and adjoin the drift region; two gate regions of a second conductivity type which are spaced apart by the drift region, each of the two gate regions form a respective pn-junction with one of the two channel regions; two body regions which are arranged vertically below the two gate regions, each of the two body regions form a further pn-junction with one of the two channel regions; and two source regions of the first conductivity type. Each of the two source regions has a higher maximum doping concentration than the two channel regions and adjoins one of the two channel regions. An anode region of a second band-gap material is arranged at the main surface. The second band-gap material has a lower band-gap than the first band-gap material. The anode region is of a second conductivity type and forms a heterojunction with the drift region.

According to an embodiment of a field-effect semiconductor device, the field-effect semiconductor device includes a semiconductor body having a main surface. The semiconductor body includes in a vertical cross-section which is substantially orthogonal to the main surface: a drift region of a first conductivity and made of a first band-gap material; a source region of the first conductivity type and made of the first band-gap material, the source region having a higher maximum doping concentration than the drift region; a body region of a second conductivity type and made of the first band-gap material, the body region being arranged between the source region and the drift region; a gate electrode arranged in a vertical trench extending from the main surface at least partly in the drift region, the gate electrode being insulated from the source region, the drift region and the body region by a gate dielectric region; and an anode region of a second band-gap material having a lower band-gap than the first band-gap material. The anode region is of a second conductivity type, forms a heterojunction with the drift region and is arranged below the main surface.

According to an embodiment of a method for producing a field-effect semiconductor device, the method includes: forming a JFET-structure in a first band-gap material and forming an anode region of a second conductivity type and of a second band-gap material having a lower band-gap than the first band-gap material. The JFET-structure is formed such that the JFET-structure includes: a drift region of a first conductivity type and extending to a main surface of the first band-gap material; a first gate region of a second conductivity type which adjoins the drift region; a first source region of the first conductivity type which is in ohmic contact with the drift region through a first channel region having a lower maximum doping concentration than the first source region; and a first body region of the second conductivity type which is arranged below the first gate region and adjoins the first channel region such that the first channel region is arranged between the first gate region and the first body region. The anode region is formed at the main surface and forms a heterojunction with the drift region.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
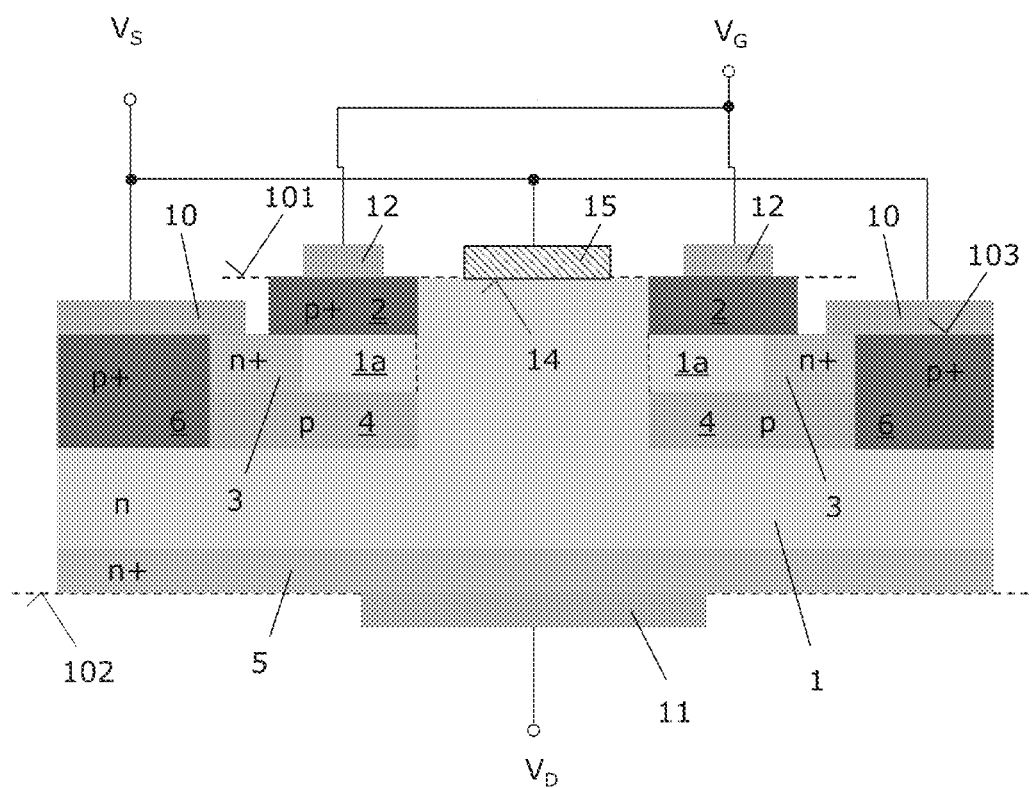
FIG. 1 illustrates a vertical cross-section through a semiconductor body of a semiconductor device according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

Specific embodiments described in this specification pertain to, without being limited thereto, to semiconductor devices, in particular to field effect semiconductor transistors and manufacturing methods therefor. Within this specification the terms "semiconductor device" and "semiconductor component" are used synonymously. The semiconductor device typically includes a field-effect structure and an integrated free-wheeling diode. The field-effect structure may be a JFET-structure, a MOSFET or an IGBT-structure (Insulated Gate Bipolar Transistor-structure) having a pn-junction forming a body diode between a drift region of the first conductivity type and a body region of the second conductivity type. The semiconductor device is typically a vertical semiconductor device having two load metallizations, for example a source metallization and a drain metallization, which are arranged opposite to each other and in low resistive contact with a respective contact region. The field-effect structure may also be formed by a HEMT-structure (High Electron Mobility Transistor-structure) employing forming and/or influencing a very thin layer of highly mobile conducting electrons with very high concentration, forming e.g. a two-dimensional electron gas, close to a heterojunction formed between two adjoining semiconductor regions of different band gaps.

The term "commutating" as used in this specification intends to describe the switching of the current of a semiconductor device from a forward direction or conducting direction in which a pn-load junction, for example the pn-junction between the body region and the drift region, is forwardly biased to the opposite direction or reverse direction in which the pn-load junction is reversely biased. Operating the semiconductor device with reversely biased pn-load junction is in the following also referred to as operating the semiconductor device in a blocking mode. Likewise, operating the semiconductor device with forwardly biased pn-load junction is in the following also referred to as operating the semiconductor device in a forward mode. The term "hard commutating" as used in this specification intends to describe commutating with a speed of at least about $10^{10}$ V/s, more typically with a speed of at least about $2*10^{10}$ V/s.

Typically, the semiconductor device is a power semiconductor device having an active area with a plurality of IGBT-cells or MOSFET-cells for carrying and/or controlling a load current between the two load metallizations. Furthermore, the power semiconductor device has typically a peripheral area with at least one edge-termination structure at least partially surrounding the active area when seen from above.

The term "power semiconductor device" as used in this specification intends to describe a semiconductor device on a single chip with high voltage and/or high current switching capabilities. In other words, power semiconductor devices are intended for high current, typically in the Ampere range.

Within this specification the terms "power semiconductor device" and "power semiconductor component" are used synonymously.

The term "field-effect" as used in this specification intends to describe the electric-field mediated formation of a conductive "channel" of a first conductivity type and/or control of conductivity and/or shape of the channel between two regions of the first conductivity type. The conductive channel may be formed and/or controlled in a semiconductor region of a second conductivity type, typically a body region of the second conductivity type, which is arranged between the two regions of the first conductivity type. Due to the field-effect, a unipolar current path through the channel region is formed and/or controlled between a source region or emitter region of the first conductivity type and a drift region of the first conductivity type in a MOSFET-structure and an IGBT-structure, respectively. The drift region may be in contact with a higher doped drain region of the first conductivity type or a higher doped collector region of the second conductivity type, respectively. The drain region or the collector region is in low resistive electric contact with a drain or collector electrode. The source region or emitter region is in low resistive electric contact with a source or emitter electrode. In a JFET-structure, the channel region is typically formed by a portion of the drift region of the first conductivity type arranged between a gate region and a body region of the second conductivity type, and may be controlled by changing the width of a depletion layer formed between the gate region and the channel region.

In the context of the present specification, the terms "in ohmic contact", in resistive electric contact" and "in resistive electric connection" intend to describe that there is an ohmic current path between respective elements or portions of a semiconductor device at least when no voltages or only low probe voltages are applied to and/or across the semiconductor device. Likewise, the terms in low ohmic contact, "in low resistive electric contact" and "in low resistive electric connection" intend to describe that there is a low resistive ohmic current path between respective elements or portions of a semiconductor device at least when no voltages are applied to and/or across the semiconductor device. Within this specification the terms "in low ohmic contact", "in low resistive electric contact", "electrically coupled", and "in low resistive electric connection" are used synonymously. In some embodiments, the resistivity of a low resistive current path between respective elements or portions of a semiconductor device which is low when low voltages are applied to and/or across the semiconductor device, for example a probe voltage of less than one or a few volts, becomes high above a threshold voltage, for example due to depleting a semiconductor region forming at least a part of the current path.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively.

In the context of the present specification, the term "gate electrode" intends to describe an electrode which is situated next to, and configured to form and/or control a channel region. The term "gate electrode" shall embrace an electrode which is situated next to, and insulated from the body region by an insulating region forming a gate dielectric region and configured to form and/or control a channel region next to a heterojunction or through the body region as well as an electrode in low resistive electric contact with a gate region adjoining a channel region of an opposite doping type and configured to shape a depleted portion in the channel region by charging to an appropriate voltage.

In the context of the present specification, the term "field electrode" intends to describe an electrode which is arranged next to a semiconductor region, typically the drift region, insulated from the semiconductor region and the semiconductor body, respectively, and configured to expand a depleted portion in the semiconductor region by charging to an appropriate voltage, typically a negative voltage with regard to the surrounding semiconductor region for an n-type semiconductor region. Typically, the gate electrode and field electrode, respectively, is formed by a conductive region, arranged in or on the semiconductor body and is insulated from the semiconductor body by an insulating region forming a field dielectric region. During the blocking mode, charges, typically negative charges for an n-type semiconductor region adjoining the insulating region, so that a portion of the semiconductor region is depleted by the charges. The conductive region may be made of a material with high enough electric conductivity so that the conductive region forms an equipotential region during device operation. For example, the conductive region may be made of a material with metallic or near-metallic electric conductivity such as a metal, for example wolfram, highly doped poly-silicon, a silicide or the like. Typically, the conductive region is in resistive electric connection with a gate metallization of the semiconductor device. The insulating region may be made of any suitable dielectric material such as silicon oxide, for example thermal silicon oxide, silicon nitride, siliconoxynitride or the like.

In the context of the present specification, the term "metallization" intends to describe a region or a layer with metallic or near metallic properties with respect to electric conductivity. A metallization may be in contact with a semiconductor region to form an electrode, a pad and/or a terminal of the semiconductor device. The metallization may be made of and/or comprise a metal such as Al, Ti, W, Cu and Co but may also be made of a material with metallic or near metallic properties with respect to electric conductivity such as highly doped n-type or p-type poly-Si, TiN or an electrically conductive silicide such as $TaSi_2$, $TiSi_2$, PtSi, $CoSi_2$, $WSi_2$ or the like. The metallization may also include different electrically conductive materials, for example a stack of those materials.

In the context of the present specification, the term "mesa" or "mesa region" intends to describe a semiconductor region between two adjacent trenches extending into the semiconductor substrate or body in a vertical cross-section.

In the following, embodiments pertaining to semiconductor devices and manufacturing methods for forming semiconductor devices are explained mainly with reference to silicon carbide (SiC) semiconductor devices. Accordingly, a monocrystalline semiconductor region or layer is typically a monocrystalline SiC-region or SiC-layer. It should, however, be understood that the semiconductor body can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a high band gap material such as SiC or GaN which has a high breakdown voltage and high critical avalanche field strength, respectively, the doping of the respective semiconductor regions can be chosen higher which reduces the on-state resistance Ron in the following also referred to as on-resistance Ron.

With reference to FIG. 1, embodiments of a field-effect semiconductor device 100 and a method for forming the field-effect semiconductor device 100 are explained. FIG. 1 illustrates a vertical cross-section through a semiconductor body of the semiconductor device 100. The semiconductor body has a main surface 101 with a normal direction defining a vertical direction and an opposite surface 102 which is arranged opposite to the main surface 101. In the following the main surface 101 is also referred to as main horizontal surface.

In the exemplary embodiment, the semiconductor body includes six semiconductor regions 1 to 6 of a first monocrystalline semiconductor material having a first band-gap, for example six monocrystalline SiC-regions 1 to 6. The first, third and fifth semiconductor regions 1, 3, 5 are of the n-doping type and typically form a drift region 1, a source region 3 and a drain region 5, respectively. The second, fourth and sixth semiconductor regions 2, 4, 6 are of the p-doping type and typically form a gate region 2, a body region 4 and a body contact region 6, respectively. The doping relations may however also be reversed.

In the exemplary embodiment illustrated in FIG. 1, the drift region 1 and the gate region 2 extend to the main surface 101 while the body contact region 6 and the source region 3 extend to a further substantially horizontal surface 103 of the semiconductor body which is arranged between the main surface 101 and the opposite surface 102. This is however only one embodiment which may be implemented when SiC is used as the first semiconductor material. This typically facilitates manufacturing since the doped semiconductor regions 2 to 6 are typically formed easier by deposition of doped SiC compared to using implantations and drive-in due to low diffusion coefficient limitations of dopants in SiC. In other embodiments, the body contact region 6 and the source region 3 also extend to the main surface 101, for example when Si is used as the first semiconductor material.

A source metallization 10 is in low resistive electric connection with the source region 3 and the body region 4 via the body contact region 6 which adjoins the body region 4. Further, a gate metallization 12 is in low resistive electric connection with the gate region 2. In the exemplary embodiment, the gate metallization 12 adjoins the gate region 2, and the source metallization 10 adjoins the source region 3 and the body contact region 6. In other embodiments, the low resistive contacts are implemented via respective through contacts extending through an interelectrode dielectric layer arranged between the metallizations 10, 12 and the semiconductor body, i.e. on the main surface 101 and the further surface 103, respectively.

A drain metallization 11 is typically arranged opposite to the source metallization 10, typically on the opposite surface 102 and in low resistive electric connection with the drift region 1 via the drain region 5 which has a higher maximum doping concentration than the drift region 1. Accordingly, the semiconductor device 100 is a three terminal semiconductor device.

A channel region 1a of the first conductivity type is arranged between and adjoins the drift region 1 and the source region 3. Thus, the source region 3 is in resistive electric connection with the drift region 1 at least when no or only low probe voltages are applied to the three metallizations 10, 11, 12.

The channel region 1a is arranged between and forms respective pn-junctions with the gate region 2 and the body region 4 which is typically arranged below the gate region 2. In the following, the pn-junction formed between the left gate region 2 and the left or first channel region 1a, respectively, is referred to as first pn-junction. The pn-junction formed between the left body region 4 and left channel region 1a is in the following referred to as second pn-junction.

Likewise, the pn-junction formed between the right gate region 2 and the right or second channel region 1a is referred to as third pn-junction. The pn-junction formed between the right body region 4 and right channel region 1a is in the following referred to as fourth pn-junction.

Depending on the voltage difference $V_{GS}=V_G-V_S$ between the gate metallization 12 and the source metallization 10 and the voltage difference $V_{DS}=V_D-V_S$ between the drain metallization 11 and the source metallization 10, respective space charge regions may be formed at the first, second, third and fourth pn-junctions and extend into the channel regions 1a. The space charge regions typically also extend into the gate region(s) 2 and body region(s) 4, respectively, however to a lesser extent due to the typically higher maximum doping concentration of the gate region 2 and the body region 4 as compared to the channel regions 1a. When the space charge regions in the left and right channel regions 1a merge, the ohmic current path between the source metallization 10 and the drain metallization 12 through the channel regions 1a is broken. In the exemplary embodiment, the resistive current path through the channel regions 1a is broken when $V_{DS}+|V_{GS}|$ is equal to or larger than a pinch-off voltage $V_p$ which depends on geometry and doping relations. Accordingly, the semiconductor device 100 may be operated as normally-on JFET.

In the exemplary embodiment illustrated in FIG. 1, the drift region 1 extends to the main surface 101 and is in a horizontal direction arranged between two portions of the gate region 2 which are arranged substantially mirror-symmetrically with respect to a central vertical axis. The two portions which are spaced apart from each other in the vertical cross-section of FIG. 1 may also be spaced apart from each other by the drift region 1 when viewed from above, i.e. may form a first and a second gate region, or may form portions of a contiguous region which is, for example, substantially ring-shaped when viewed from above.

Furthermore, each of the source region 3, the body region 4 and the body contact region 6, as well as the gate metallization 12 and the source metallization 10 also has two respective portions which are arranged substantially mirror-symmetrically with respect to the central vertical axis in the exemplary embodiment. Accordingly, the two channel regions 1a are arranged substantially mirror-symmetrically with respect to the central vertical axis in this embodiment. Each of the two respective portions of the source region 3, the body region 4, the body contact region 6, the channel region 1a, the gate metallization 12 and the source metallization 10 may be portions of a respective contiguous region or may be separated when viewed from above.

The illustrated cross-section of FIG. 1 may only correspond to a section, for example to a section of a unit cell. According to an embodiment, the semiconductor device 100 is a power semiconductor device which includes a plurality of unit cells typically forming a 1-dimensional or 2-dimensional lattice when viewed from above.

Furthermore, the drain metallization 11 may completely cover the opposite surface 102.

According to an embodiment, an anode region 15 of a second semiconductor material which has a second band-gap lower than the first band-gap, for example by at least 0.2 eV, more typically by at least 0.4 eV, even more typically be at least 1 eV, adjoins the drift region 1. Accordingly, a heterojunction 14 is formed between the drift region 1 and the anode region 15. Typically, the anode region 15 is of the second conductivity type. The anode region 15 is spaced apart from the source region 3 but in resistive, typically low resistive, connection with the source metallization 10 and source region 3, respectively. Accordingly, an integrated heterojunction diode is formed between by the anode region 15 and the drift region 1 which may be operated as integrated free-wheeling diode. In general, the semiconductor body includes two semiconductor materials of different band-gaps and a heterojunction 14 formed therebetween.

Furthermore, integrating the free-wheeling diode into the semiconductor device 100 does not require complex additional process steps.

For example, in a first process sequence a normally-on JFET-semiconductor structure is formed which includes only semiconductor regions of the first semiconductor material, for example Si, GaN or SiC. This is typically done at the wafer-level and may include one or more epitaxial deposition processes and/or one or more implantation processes followed by thermal drive-in and/or one or more in-diffusion processes to form the semiconductor regions 1 to 6 of the first semiconductor material in and/or on a wafer of the first semiconductor material, for example a SiC-wafer, so that the JFET-structure includes at least a drift region 1 of the first conductivity type which extends to the main surface 101, a gate region 2 forming a pn-junction with the drift region 2, and a source region 3 of the first conductivity type, in resistive electric connection with the drift region 1 and having a higher maximum doping concentration than the drift region 1.

Thereafter, an anode region 15 of a second conductivity type and made of a second semiconductor material having a second band-gap lower than the first band-gap is formed on the main surface 101 so that the anode region 15 forms a heterojunction 14 with the drift region 1.

Thereafter, a source metallization 10 in resistive electric connection with the source region 3 and the anode region 15, and a gate metallization 12 in resistive electric connection with the gate region 2 may be formed. Further, a drain metallization 11 may be formed opposite to the source metallization 10 and in resistive electric connection with the drift region 1, for example via a higher doped drain region 5 of the first conductivity type.

The source metallization 10 and the anode region 15 may adjoin each other in another vertical cross-section and when viewed from above, respectively. Accordingly, no further pad and external wiring is required for connecting the anode region 15.

In the exemplary embodiment illustrated in FIG. 1, the anode region 15 is arranged above the drift region 1 and, when viewed from above, between the two portions of the gate region 2. Accordingly, no extra space is required for integrating the free-wheeling diode into the JFET.

Furthermore, the anode region 15 is spaced apart from the gate region 2 and forms a heterojunction 14 only with the drift region 1.

The first semiconductor material, which is also referred to as first band-gap material, is monocrystalline and may, for example be GaN, SiC, Si or $Si_xGe_{1-x}$ with x-being below about 0.3. $Si_xGe_{1-x}$ may be used to increase cut-off frequency of the transistor structure due to the reduced hole current. Typical combinations of the first semiconductor material and the second semiconductor material include SiC/Si, SiC/Ge, Si/Ge, and GaN/Si, to mention a few.

The second semiconductor material, which is also referred to as second band-gap material, may also be a monocrystalline semiconductor material.

In other embodiments, the anode region 15 is formed by a non-monocrystalline semiconductor material, for example a polycrystalline or amorphous semiconductor material. This facilitates manufacturing.

For example, the anode region 15 may be formed on 4H-SiC by depositing a doped polycrystalline Si-layer, using e.g. a low pressure chemical vapour deposition (LPCVD) and masked back-etching. Other polytypes of SiC such as 6H, 3C or the like may also be used. The polycrystalline Si-layer and anode region 15, respectively, may have a vertical thickness of about 200 nm to about 1 μm, for example about 500 nm. The maximum doping concentration of the typically p-type anode region 15 may be at least about $10^{19}$ cm$^{-3}$, for example about $10^{20}$ cm$^{-3}$ or even higher while the maximum doping concentration of the typically n-type drift region 1 may be only about $10^{16}$ cm$^{-3}$, i.e. typically at least three orders of magnitude lower, for example about four orders of magnitude lower than the maximum doping concentration of the anode region 15. Under these conditions, the leakage current of the formed heterojunction diode is about one order of magnitude lower compared to an integrated Schottky diode while the on-resistance is reduced by a factor of about 5 and the blocking voltage is increased by about 30% compared to the integrated Schottky diode. Accordingly, the device performance is remarkably increased compared to using integrated Schottky diodes.

According to an embodiment, the semiconductor body of the first band-gap material extends to the main surface 101 and includes in the illustrated vertical cross-section: a drift region 1 of the first conductivity type which extends to the main surface 101; two channel regions 1a of the first conductivity type which are spaced apart by and adjoin the drift region 1; two gate regions 2 of the second conductivity type which are spaced apart by the drift region 1, each of the two gate regions 2 forming a respective pn-junction with one of the two channel regions 1a; two body regions 4 which are arranged vertically below the two gate regions 2, each of the two body regions 4 forming a further or lower pn-junction with one of the two channel regions 1a; and two source regions 3 of the first conductivity type. Each of the two source regions 3 has a higher maximum doping concentration than the two channel regions 1a and adjoins one of the two channel regions 1a. An anode region 15 of a second band-gap material is arranged on the main surface 101. The band gap of the second band-gap material is lower than the band-gap of the first band-gap material. The anode region 15 is of a second conductivity type and forms a heterojunction 14 with the drift region 1.

Due the arrangement of anode region 15 on the main surface 101, manufacturing of the semiconductor device 100 is facilitated compared to forming the heterojunction below the main surface 101 and spaced apart from on the main surface 101, respectively, for example as a buried region.

In other embodiments, the anode region 15 may extend across the main surface 101 and/or may be formed in a shallow trench. In these embodiments, the anode region 15 is at least arranged at the main surface 101.

Figure 2:
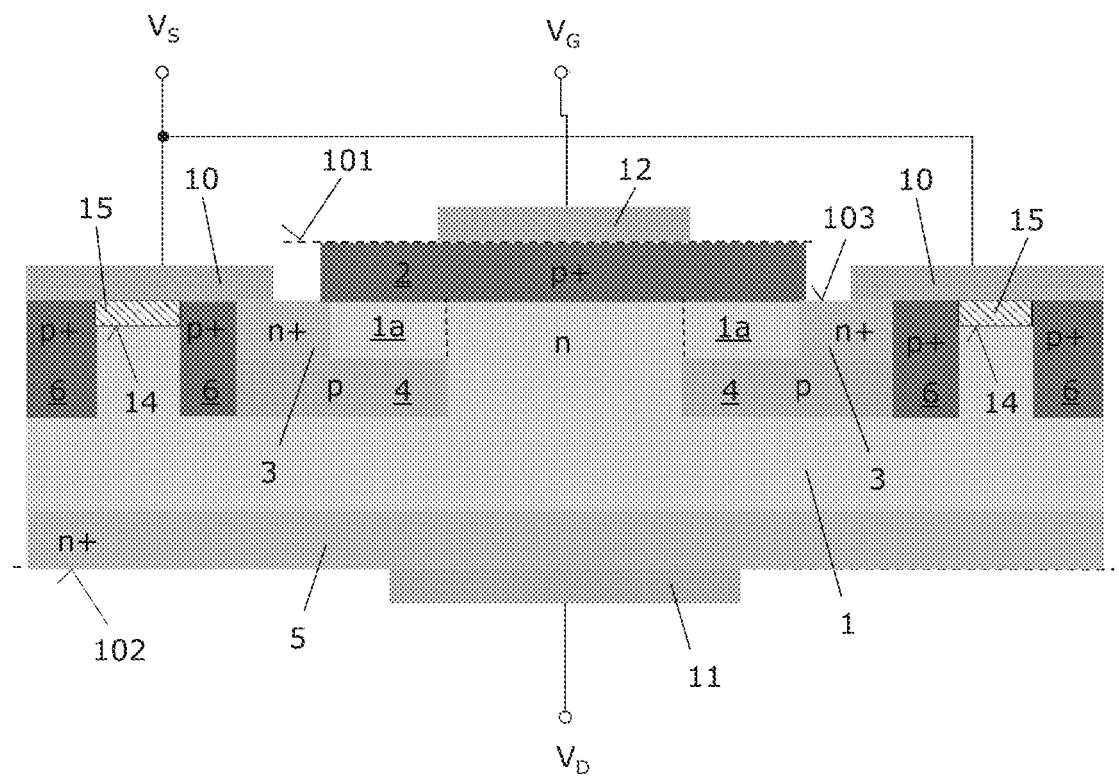
FIG. 2 illustrates a vertical cross-section through a semiconductor body of a semiconductor device according to an embodiment.

FIG. 2 shows a vertical cross-section through a semiconductor device 200. The semiconductor device 200 shown in FIG. 2 is similar to the semiconductor device 100 explained above with regard to FIG. 1. The semiconductor device 200 may also be operated as normally-on JFET and includes an integrated heterojunction diode forming a freewheeling diode. However, in the exemplary embodiment illustrated in FIG. 2, the anode region(s) 15 adjoin at least one of the body contact regions 6. Furthermore, there is only one gate region 2 which extends, in horizontal direction, at least between the two portions of the source region 3.

In the exemplary embodiment illustrated in FIG. 2, the anode region(s) 15 extend to a further horizontal surface 103 of the semiconductor body, i.e. arranged at horizontal surface 103. This may also facilitate manufacturing.

The semiconductor devices 100, 200 explained above with regard to FIGS. 1, 2 have in common that a semiconductor body of a first band-gap material includes in a cross-section which is substantially vertical to the main surface 101: a drift region 1 of a first conductivity type; a first channel region 1a of the first conductivity type which adjoins the drift region 1; a first gate region 2 which forms a first pn-junction with the first channel region 1a; a first body region 4 which is arranged below the first gate region 2 and forms a second pn-junction with the first channel region 1a such that the first channel region 1a is arranged between the first pn-junction and the second pn-junction; and a first source region 3 of the first conductivity type which has a higher maximum doping concentration than and adjoins the first channel region 1a. An anode region 15 of a second band-gap material having a second band-gap lower than a band-gap of the first band-gap material forms a heterojunction 14 with the drift region 1. The anode region 15 is of a second conductivity type. The heterojunction 14 and the first source region 3 do not overlap when seen from above.

Figure 3:
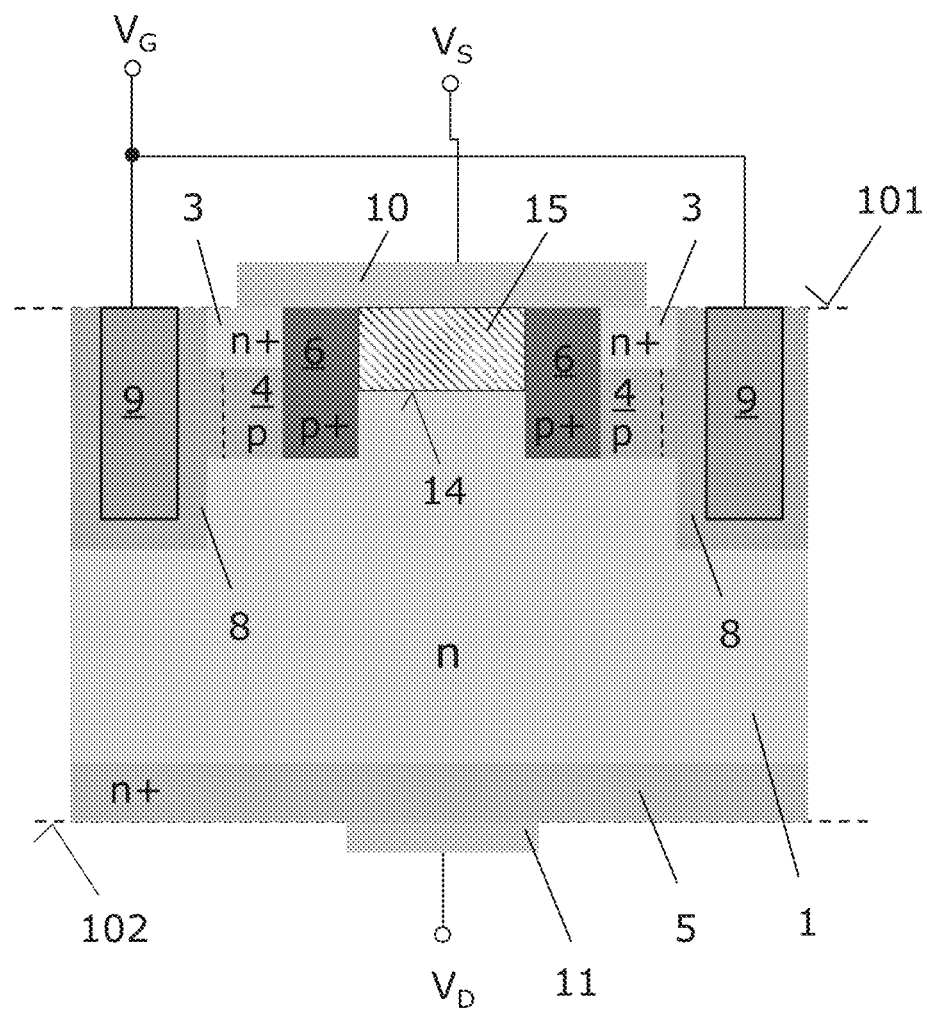
FIG. 3 illustrates a vertical cross-section through a semiconductor body of a semiconductor device according to an embodiment.

FIG. 3 illustrates a vertical cross-section through a semiconductor device 300. The semiconductor device 300 may also be operated as field-effect semiconductor device with a free-wheeling diode formed by an integrated heterojunction diode.

The semiconductor device 300 typically includes a trench-gate MOSFET-structure. In the exemplary embodiment, the semiconductor body includes five semiconductor regions 1, and 3 to 6 made of a first semiconductor material, namely a drift region 1 of a first conductivity, a source region 3 of the first conductivity type which is spaced apart from the drift region 1, has a higher maximum doping concentration than the drift region 1 and extends to a main surface 101 of the semiconductor body, a body region 4 of a second conductivity type which is arranged between and forms respective pn-junctions with the source region 3 and the drift region 1, a drain contact region 5 of the first doping type, which extends to an opposite surface 102, and a body contact region 6 which extends to the main surface 101.

A gate electrode 9 is arranged in a vertical trench which extends from the main surface 101 along the source region 3 and the body region 4 and into the drift region 1. The gate electrode 9 is insulated from the source region 3, the drift region 1 and the body region 4 by a gate dielectric region 8. Accordingly, a channel region of the first conductivity type may be formed in body region 4 along the gate dielectric region 8 by appropriately driving the gate electrode 9.

An anode region 15 of a second conductivity type and made of a second semiconductor material having a second band-gap lower than the first band-gap is arranged between the drift region 1 and the main surface 101, and forms a heterojunction 14 with the drift region 1.

In the exemplary embodiment illustrated in FIG. 3, the anode region 15 adjoins a first and a second body contact region 6, and a first portion and a second portion of the body contact region 6, respectively, of two adjacent MOSFET-cells each of which has a respective trench gate electrode-structure 8, 9. The semiconductor device 300 is typically a power semiconductor device which includes a plurality of MOSFET-cells.

A source metallization 10 is arranged on the main surface 101 and in resistive electric connection with the source region 3, the anode region 15, and the body contact region 6.

Further, a drain metallization 11 is arranged on the opposite surface 102 and is in low resistive connection with the drift region 1 via a drain contact region 5. For sake of clarity, a gate metallization which may be arranged on the main surface 101 and is in resistive connection with the gate electrode(s) 9 is not illustrated in FIG. 3.

The material properties of the semiconductor device 300 may be chosen as explained above with regard to FIGS. 2 and 3.

Owing to the integrated heterojunction diode, the device performance of the semiconductor device 300 is typically improved compared to similar devices with an integrated Schottky diode.

Figure 4:
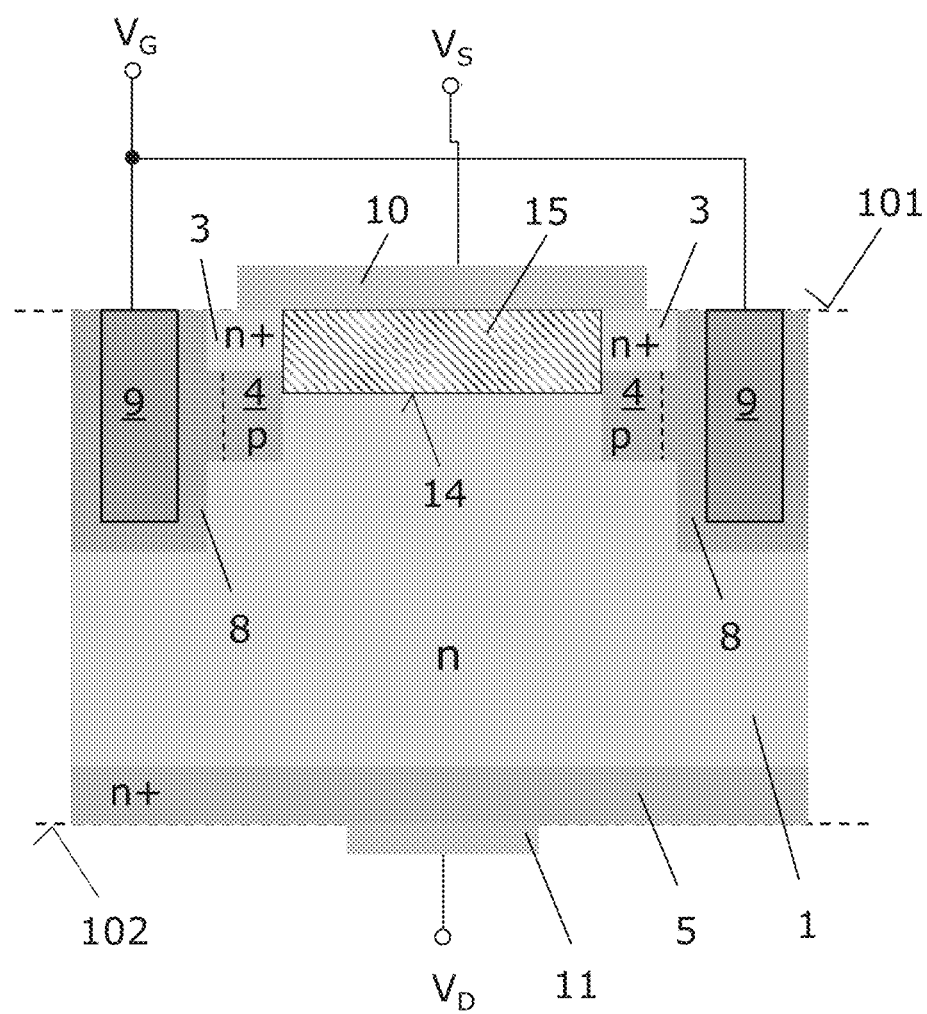
FIG. 4 illustrates a vertical cross-section through a semiconductor body of a semiconductor device according to an embodiment.

FIG. 4 illustrates a vertical cross-section through a semiconductor device 400. The semiconductor device 400 is similar to the semiconductor device 300 explained above with regard to FIG. 3 and may also be operated as a MOSFET with integrated free-wheeling diode. However, the semiconductor device 400 illustrated in FIG. 4 has no body contact region. Instead, the typically highly doped anode region 15 adjoins the body region 4 for contacting to the source metallization 10. This way, high latch-up stability of the semiconductor device 400 is ensured without an additional body contact region. This facilitates manufacturing.

The semiconductor devices 300, 400 illustrated in FIGS. 3 and 4 may be formed similar as explained above with regard to FIG. 1, i.e. by forming a MOSFET-structure including an insulated trench gate electrode in a semiconductor body of the first semiconductor material, forming an additional trench in the semiconductor body and filling the additional trench with a second semiconductor material having a lower band-gap. Thereafter, the source, gate, and drain metallizations may be formed.

According to an embodiment of a field-effect semiconductor device, the field-effect semiconductor device includes a semiconductor body and a source electrode. The semiconductor body includes a drift region, a gate region and a source region of a first semiconductor material having a first band-gap and an anode region of a second semiconductor material having a second band-gap which is lower than the first band-gap. The drift region is of a first conductivity type. The gate region forms a pn-junction with the drift region. The source region is of the first conductivity type and in resistive electric connection with the drift region and has a higher maximum doping concentration than the drift region. The anode region is of the second conductivity type, forms a heterojunction with the drift region and is spaced apart from the source region. The source metallization is in resistive electric connection with the source region and the anode region.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A field-effect semiconductor device, comprising:
   a semiconductor body of a first band-gap material and having a main surface, the semiconductor body comprising in a cross-section which is substantially vertical to the main surface:
      a drift region of a first conductivity type;
      a first channel region of the first conductivity type and adjoining the drift region;
      a first gate region forming a first pn-junction with the first channel region;
      a first body region arranged below the first gate region and forming a second pn-junction with the first channel region such that the first channel region is arranged between the first pn-junction and the second pn-junction; and
      a first source region of the first conductivity type, having a higher maximum doping concentration than the first channel region and adjoining the first channel region; and
   an anode region of a second band-gap material having a lower band-gap than the first band-gap material, the anode region being of a second conductivity type and forming a heterojunction with the drift region, wherein the heterojunction and the first source region do not overlap when viewed from above.

2. The semiconductor device of claim 1, further comprises in the cross-section at least one of:
   a second channel region of the first conductivity type and adjoining the drift region;
   a second gate region forming a third pn-junction with the second channel region;
   a second body region arranged below the second gate region and forming a fourth pn-junction with the second channel region such that the second channel region is arranged between the third pn-junction and the fourth pn-junction;
   a second source region of the first conductivity type having a higher maximum doping concentration than the second channel region and adjoining the second channel region;
   a source metallization in ohmic contact with at least one of the anode region, the first source region, the second source region, the first body region and the second body region;
   a gate metallization in ohmic contact with at least one of the first gate region and the second gate region; and
   a drain metallization arranged opposite to the source metallization and in ohmic contact with the drift region.

3. The semiconductor device of claim 1, wherein the drift region extends to the main surface, and wherein the anode region is arranged above the drift region.

4. The semiconductor device of claim 1, wherein the first band-gap material is selected from the group consisting of GaN, SiC, Si and $Si_xGe_{1-x}$.

5. The semiconductor device of claim 1, wherein the second band-gap material is selected from the group consisting of Si and Ge.

6. The semiconductor device of claim 1, wherein the second band-gap material is a non-monocrystalline semiconductor material.

7. The semiconductor device of claim 1, wherein a maximum doping concentration of the anode region is at least three orders of magnitude higher than a maximum doping concentration of the drift region.

8. The semiconductor device of claim 1, wherein the anode region has a maximum doping concentration of at least about $10^{20}$ cm$^{-3}$.

9. A field-effect semiconductor device, comprising:
   a semiconductor body of a first band-gap material, having a main surface and comprising in a cross-section which is substantially vertical to the main surface:
      a drift region of a first conductivity type and extending to the main surface;
      two channel regions of the first conductivity type which are spaced apart by the drift region;
      two gate regions of a second conductivity type which are spaced apart by the drift region, each of the two gate regions forming a respective pn-junction with one of the two channel regions;
      two body regions arranged vertically below the two gate regions, each of the two body regions forming a further pn-junction with one of the two channel regions; and
      two source regions of the first conductivity type, each of the two source regions comprising a higher maximum doping concentration than an adjoining of the two channel regions; and
      an anode region of a second band-gap material arranged at the main surface, the second band-gap material having a lower band-gap than the first band-gap material, the anode region being of a second conductivity type and forming a heterojunction with the drift region wherein the heterojunction and the two source regions do not overlap when viewed from above.

10. The semiconductor device of claim 9, wherein the anode region forms the heterojunction only with the drift region.

11. The semiconductor device of claim 9, further comprising in the cross-section at least one of:
   a source metallization in ohmic contact with at least one of the anode region, the two source regions, and the two body regions;
   a gate metallization in ohmic contact with at least one of the two gate regions; and
   a drain metallization arranged opposite to the source metallization and in ohmic contact with the drift region.

12. The semiconductor device of claim 9, wherein the anode region is spaced apart from at least one of the two gate regions, the two body regions and the two source regions when viewed from above.

13. The semiconductor device of claim 9, wherein a maximum doping concentration of the anode region is at least three orders of magnitude higher than a maximum doping concentration of the drift region.

14. The semiconductor device of claim 9, wherein the first band-gap material is a monocrystalline semiconductor material selected from the group consisting of GaN, SiC, Si and $Si_xGe_{1-x}$.

15. The semiconductor device of claim 9, wherein the second band-gap material is selected from the group consisting of Si and Ge.

16. The semiconductor device of claim 9, wherein the second band-gap material is a non-monocrystalline semiconductor material.

* * * * *

UNITED STATES PATENT AND TRADEMARK OFFICE
CERTIFICATE OF CORRECTION

PATENT NO. : 9,064,887 B2  
APPLICATION NO. : 13/602614  
DATED : June 23, 2015  
INVENTOR(S) : W. Werner Page 1 of 1

It is certified that error appears in the above-identified patent and that said Letters Patent is hereby corrected as shown below:

Title Page/item (56) Other Publications, page 1, column 2, line 2, please change "Heterjunction Diode" to -- Heterojunction Diode --

Signed and Sealed this  
Twenty-sixth Day of January, 2016

Michelle K. Lee  
*Director of the United States Patent and Trademark Office*